United States Patent
Chen

(10) Patent No.: US 10,236,140 B2
(45) Date of Patent: Mar. 19, 2019

(54) ILLUMINATED DUAL PRESSURE SENSING KEY

(71) Applicant: Primax Electronics Ltd., Taipei (TW)

(72) Inventor: Chung-Yuan Chen, Taipei (TW)

(73) Assignee: PRIMAX ELECTRONICS LTD, Taipei (TW)

( * ) Notice: Subject to any disclaimer, the term of this patent is extended or adjusted under 35 U.S.C. 154(b) by 0 days.

(21) Appl. No.: 15/906,124

(22) Filed: Feb. 27, 2018

(65) Prior Publication Data

US 2018/0190446 A1 Jul. 5, 2018

Related U.S. Application Data

(63) Continuation-in-part of application No. 15/220,591, filed on Jul. 27, 2016, now abandoned.

(30) Foreign Application Priority Data

May 13, 2016 (TW) .............................. 105114928 A

(51) Int. Cl.
| | | |
|---|---|---|
| H01H 13/02 | (2006.01) | |
| H01H 13/20 | (2006.01) | |
| H01H 13/64 | (2006.01) | |
| H01H 13/79 | (2006.01) | |

(52) U.S. Cl.
CPC .......... *H01H 13/64* (2013.01); *H01H 13/023* (2013.01); *H01H 13/20* (2013.01); *H01H 13/79* (2013.01); *H01H 2203/052* (2013.01); *H01H 2203/056* (2013.01); *H01H 2205/002* (2013.01); *H01H 2205/004* (2013.01); *H01H 2205/006* (2013.01); *H01H 2207/028* (2013.01); *H01H 2215/03* (2013.01); *H01H 2219/036* (2013.01); *H01H 2219/062* (2013.01); *H01H 2221/044* (2013.01); *H01H 2223/03* (2013.01); *H01H 2239/078* (2013.01)

(58) Field of Classification Search
CPC ...... H01H 13/023; H01H 13/14; H01H 13/20; H01H 2219/036; H01H 2219/062; H01H 9/161; H01H 2009/164; H01H 15/025
USPC ......... 200/308, 310, 314, 345; 400/472, 473
See application file for complete search history.

(56) References Cited

U.S. PATENT DOCUMENTS

| | | | | |
|---|---|---|---|---|
| 5,510,584 A | * | 4/1996 | Norris | .................... H01H 13/64 200/1 B |
| 6,743,993 B1 | * | 6/2004 | Clark | .................. H01H 13/702 200/314 |
| 9,899,162 B2 | * | 2/2018 | Chen | .................. H01H 13/7065 |

* cited by examiner

Primary Examiner — Vanessa Girardi
(74) Attorney, Agent, or Firm — Kirton McConkie; Evan R. Witt

(57) ABSTRACT

A key structure includes a movable element, an elastic element, a light-emitting element and a pressure sensing element. The pressure sensing element is arranged between the elastic element and the light-emitting element. The elastic element is disposed on the movable element. The light-emitting element emits a light beam. The light beam is transmitted through the pressure sensing element and projected to the movable element to illuminate the key structure. While the key structure is depressed, the elastic element is pushed by the movable element. The pressure sensing element is pushed by the elastic element according to different magnitudes of the depressing force. Consequently, the key structure generates different pressure sensing signals.

6 Claims, 9 Drawing Sheets

ILLUMINATED DUAL PRESSURE SENSING KEY

FIELD OF THE INVENTION

The present application is a continuation-in-part application claiming benefit from a pending U.S. patent application bearing a Ser. No. 15/220,591 and filed Jul. 27, 2016, contents of which are incorporated herein for reference.

FIELD OF THE INVENTION

The present invention relates to a key structure, and more particularly to a mechanical key structure.

BACKGROUND OF THE INVENTION

Generally, the widely-used peripheral input device of a computer system includes for example a mouse, a keyboard, a trackball, or the like. Through the keyboard, characters or symbols can be directly inputted into the computer system. As a consequence, most users and most manufacturers of input devices pay much attention to the development of keyboards. As known, a keyboard with scissors-type connecting elements is one of the widely-used keyboards.

Hereinafter, a key structure with a scissors-type connecting element of a conventional keyboard will be illustrated with reference to FIG. 1. FIG. 1 is a schematic side cross-sectional view illustrating a conventional key structure. As shown in FIG. 1, the conventional key structure 1 comprises a keycap 11, a scissors-type connecting element 12, a rubbery elastomer 13, a membrane switch circuit member 14 and a base plate 15. The keycap 11, the scissors-type connecting element 12, the rubbery elastomer 13 and the membrane switch circuit member 14 are supported by the base plate 15. The scissors-type connecting element 12 is used for connecting the base plate 15 and the keycap 11.

The membrane switch circuit member 14 comprises plural key intersections (not shown). When one of the plural key intersections is triggered, a corresponding key signal is generated. The rubbery elastomer 13 is disposed on the membrane switch circuit member 14. Each rubbery elastomer 13 is aligned with a corresponding key intersection. When the rubbery elastomer 13 is depressed, the rubbery elastomer 13 is subjected to deformation to push the corresponding key intersection of the membrane switch circuit member 14. Consequently, the corresponding key signal is generated.

The scissors-type connecting element 12 is arranged between the base plate 15 and the keycap 11, and the base plate 15 and the keycap 11 are connected with each other through the scissors-type connecting element 12. The scissors-type connecting element 12 comprises a first frame 121 and a second frame 122. A first end of the first frame 121 is connected with the keycap 11. A second end of the first frame 121 is connected with the base plate 15. The rubbery elastomer 13 is enclosed by the scissors-type connecting element 12. Moreover, the first frame 121 comprises a first keycap post 1211 and a first base plate post 1212. The first frame 121 is connected with the keycap 11 through the first keycap post 1211. The first frame 121 is connected with the base plate 15 through the first base plate post 1212. The second frame 122 is combined with the first frame 121. A first end of the second frame 122 is connected with the base plate 15. A second end of the second frame 122 is connected with the keycap 11. Moreover, the second frame 122 comprises a second keycap post 1221 and a second base plate post 1222. The second frame 122 is connected with the keycap 11 through the second keycap post 1221. The second frame 122 is connected with the base plate 15 through the second base plate post 1222.

The operations of the conventional key structure 1 in response to the depressing action of the user will be illustrated as follows. Please refer to FIG. 1 again. When the keycap 11 is depressed, the keycap 11 is moved downwardly to push the scissors-type connecting element 12 in response to the depressing force. As the keycap 11 is moved downwardly relative to the base plate 15, the keycap 11 pushes the corresponding rubbery elastomer 13. At the same time, the rubbery elastomer 13 is subjected to deformation to push the membrane switch circuit member 14 and trigger the corresponding key intersection of the membrane switch circuit member 14. Consequently, the membrane switch circuit member 14 generates a corresponding key signal. When the keycap 11 is no longer depressed by the user, no external force is applied to the keycap 11 and the rubbery elastomer 13 is no longer pushed by the keycap 11. In response to the elasticity of the rubbery elastomer 13, the rubbery elastomer 13 is restored to its original shape to provide an upward elastic restoring force. Consequently, the keycap 11 is returned to its original position where it is not depressed.

With increasing development of science and technology, a mechanical key structure is introduced into the market. FIG. 2 is a schematic exploded view illustrating a conventional mechanical key structure. As shown in FIG. 2, the mechanical key structure 2 comprises a keycap (not shown), a pedestal 21, an upper cover 22, a push element 23, a linkage element 24, a first spring strip 25, a second spring strip 26 and a circuit board (not shown). The pedestal 21 is covered by the upper cover 22. The upper cover 22 has an opening 221. The linkage element 24 is located at a middle region of the pedestal 21. Moreover, the linkage element 24 is movable upwardly or downwardly relative to the pedestal 21. The first spring strip 25 is partially disposed within the pedestal 21, and located near a sidewall of the pedestal 21. The second spring strip 26 is partially disposed within the pedestal 21, and arranged between the linkage element 24 and the first spring strip 25. The push element 23 and the linkage element 24 are collaboratively disposed on the pedestal 21. The push element 23 is penetrated through the opening 221 of the upper cover 22 and coupled with the keycap. Moreover, the first spring strip 25 and the second spring strip 26 are electrically connected with the circuit board.

Please refer to FIG. 2 again. The linkage element 24 has a protrusion structure 241. The protrusion structure 241 is extended from a sidewall of the linkage element 24 toward the first spring strip 25. Moreover, the first spring strip 25 comprises a fixing part 251 and an elastic part 252. The fixing part 251 is fixed on the pedestal 21. The elastic part 252 is extended from the fixing part 251. Moreover, the elastic part 252 is contacted with the protrusion structure 241 of the linkage element 24. Consequently, the elastic part 252 is movable relative to the fixing part 251.

When the keycap is depressed, the keycap is moved downwardly to push the push element 23. Consequently, the linkage element 24 connected with the push element 23 is moved downwardly. As the linkage element 24 is moved downwardly, the protrusion structure 241 of the linkage element 24 is contacted with the elastic part 252 and moved downwardly along the elastic part 252. While the linkage element 24 is quickly moved in response to the depressing force of the user, the linkage element 24 is quickly moved across the elastic part 252, and the elastic part 252 is pushed by the protrusion structure 241 of the linkage element 24. Consequently, the elastic part 252 is moved relative to the fixing part 251 to collide with the second spring strip 26. Since the first spring strip 25 and the second spring strip 26 are contacted with each other, the circuit board outputs a corresponding key signal. Moreover, while the first spring strip 25 and the second spring strip 26 are contacted with each other, a click sound is generated. Due to the click sound, the user can feel the depressing feedback.

Since the mechanical key structure 2 generates the click sound to provide the feedback feel while the keycap is depressed, the mechanical key structure 2 is favored by some users. However, the conventional mechanical key structure 2 still has some drawbacks. For example, since the structure of the conventional mechanical key structure is very simple, the functions of the conventional mechanical key structure are usually insufficient to comply with the requirements of most users.

Therefore, there is a need of providing a multifunctional mechanical key structure.

SUMMARY OF THE INVENTION

The present invention provides a multifunctional key structure in order to comply with the requirements of most users.

In accordance with an aspect of the present invention, there is provided a key structure. The key structure includes a pedestal, an upper cover, a movable element, an elastic element, a light-emitting element and a pressure sensing element. The upper cover has an upper cover opening. The pedestal is covered by the upper cover. The movable element is disposed on the pedestal and partially penetrated through the upper cover opening. While the movable element is depressed, the movable element is moved relative to the pedestal. The elastic element is sheathed around the movable element. The light-emitting element is disposed under the pedestal, and emits a light beam to the movable element. The pressure sensing element is arranged between the elastic element and the light-emitting element, and contacted with the elastic element. The pressure sensing element generates a first pressure sensing signal in response to a first force, or the pressure sensing element generates a second pressure sensing signal in response to a second force. The light beam from the light-emitting element is projected to the movable element through the pressure sensing element.

In accordance with another aspect of the present invention, there is provided a key structure. The key structure includes a pedestal, an upper cover, a movable element, an elastic element, a light-emitting element and a pressure sensing element. The upper cover having an upper cover opening. The pedestal is covered by the upper cover. The movable element is disposed on the pedestal and partially penetrated through the upper cover opening. While the movable element is depressed, the movable element is moved relative to the pedestal. The elastic element is sheathed around the movable element. The light-emitting element is disposed under the pedestal, and emits a light beam to the movable element. The pressure sensing element is disposed on the movable element, and contacted with the elastic element. The pressure sensing element generates a first pressure sensing signal in response to a first force, or the pressure sensing element generates a second pressure sensing signal in response to a second force.

From the above descriptions, the present invention provides the key structure. The key structure is equipped with a light-emitting element and a movable element that is made of a light-transmissible material. Consequently, the key structure has the illuminating function. Moreover, the key structure has the pressure sensing element. By means of the pressure sensing element, the key structure generates different pressure sensing signals according to different magnitudes of the depressing force. Since the functions of the key structure are increased, the drawbacks of the conventional technologies are overcome. Optionally, the key structure is equipped with the spring strip according to the requirements of the user. The key structure with the spring strip can provide the depressing feedback to the user. Moreover, the key structure without the spring strip has reduced volume, and thus the key structure is slim.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

For solving the drawbacks of the conventional technologies, the present invention provides a multifunctional key structure.

Figure 1:
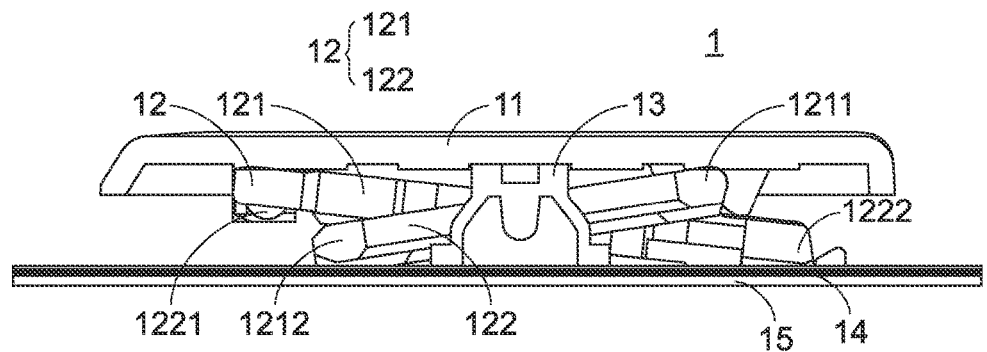
FIG. 1 is a schematic side cross-sectional view illustrating a conventional key structure.
Figure 2:
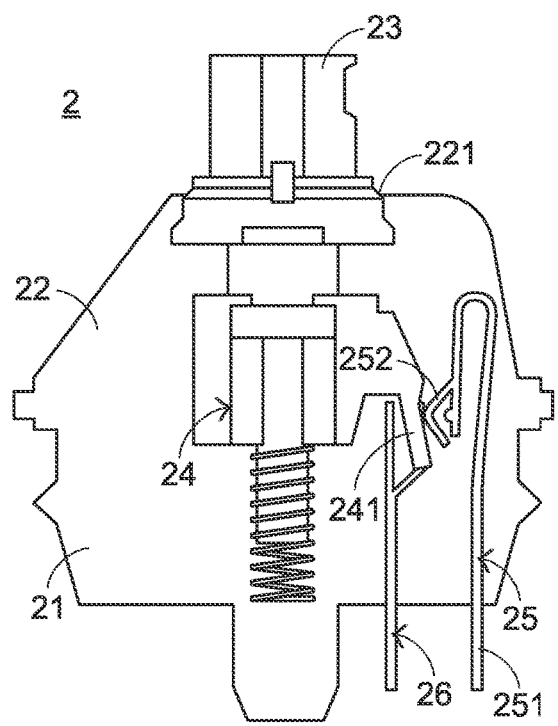
FIG. 2 is a schematic exploded view illustrating a conventional mechanical key structure.
Figure 3:
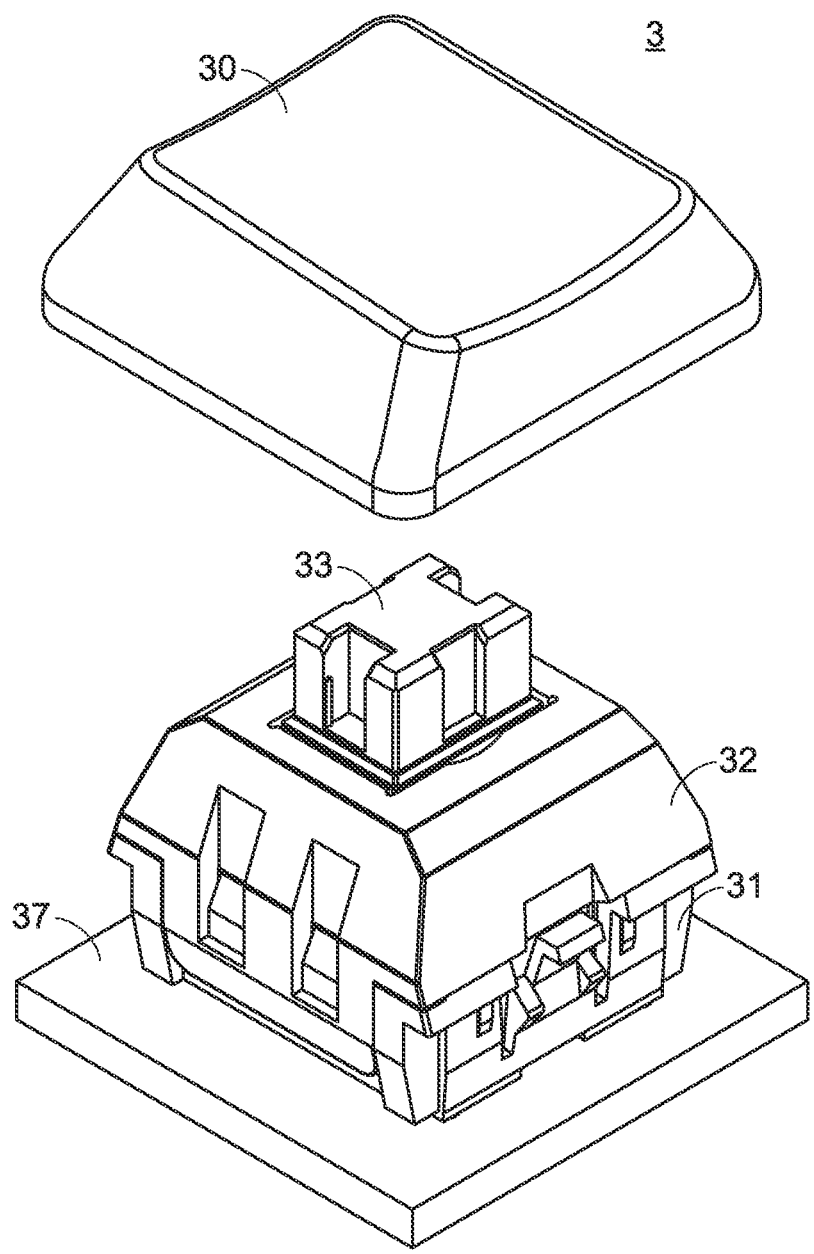
FIG. 3 is a schematic perspective view illustrating a key structure according to a first embodiment of the present invention.
Figure 4:
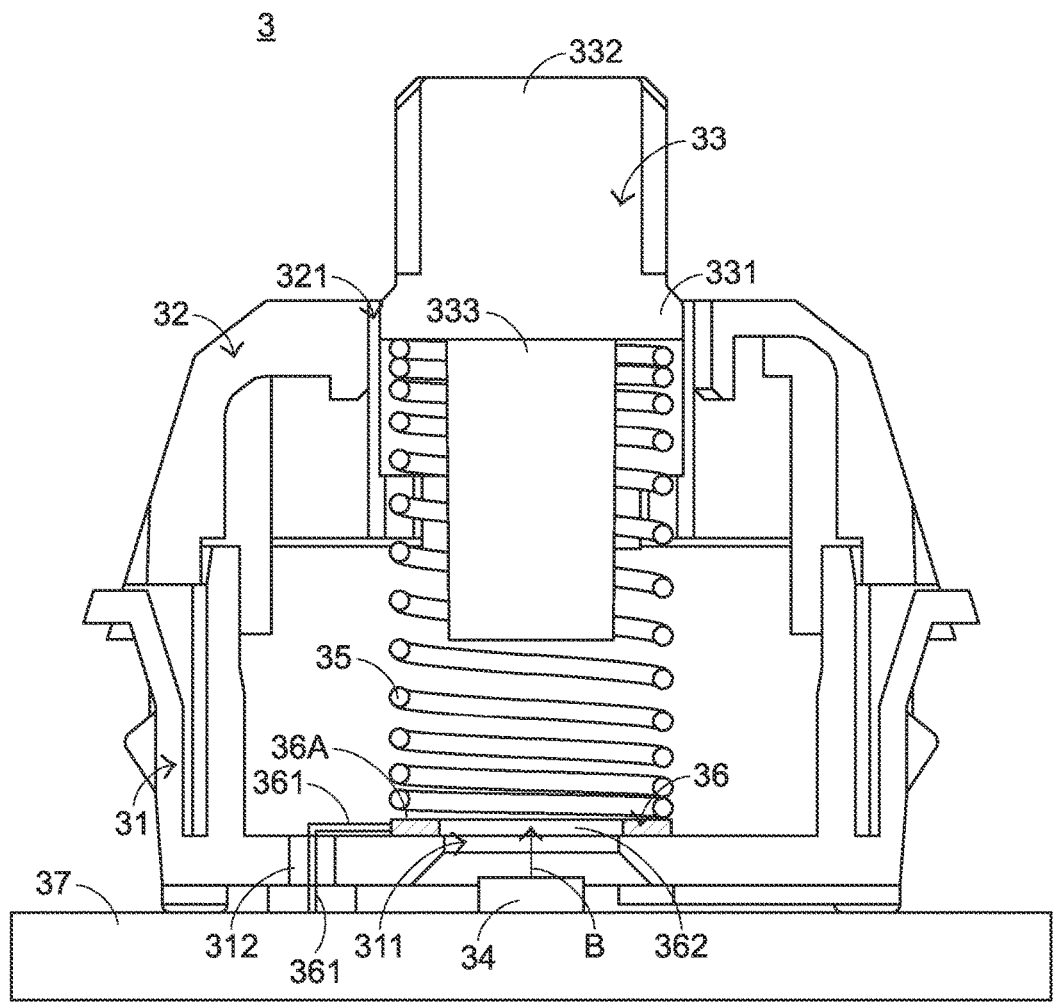
FIG. 4 is a schematic side cross-sectional view illustrating the key structure according to the first embodiment of the present invention, in which the keycap is not depressed.

FIG. 3 is a schematic perspective view illustrating a key structure according to a first embodiment of the present invention. FIG. 4 is a schematic side cross-sectional view illustrating the key structure according to the first embodiment of the present invention, in which the keycap is not depressed. As shown in FIGS. 3 and 4, the key structure 3 comprises a keycap 30, a pedestal 31, an upper cover 32, a movable element 33, a light-emitting element 34, an elastic element 35, a pressure sensing element 36 and a circuit board 37. The circuit board 37 is disposed under the pedestal 31. The pedestal 31 is covered by the upper cover 32. Moreover, the upper cover 32 has an upper cover opening 321 corresponding to the movable element 33. The keycap 30 is connected with a first end of the movable element 33 through the upper cover opening 321. The movable element 33 is installed on the pedestal 31, and penetrated through the upper cover opening 321 to be connected with the keycap 30. When the movable element 33 is depressed by the user, the movable element 33 is moved relative to the pedestal 31. The elastic element 35 is sheathed around the movable element 33. The light-emitting element 34 is disposed on the circuit board 37 and disposed under the pedestal 31. The light-emitting element 34 emits a light beam B to the movable element 33. The pressure sensing element 36 is disposed on the pedestal 31, and arranged between the elastic element 35 and the light-emitting element 34. A top surface of the pressure sensing element 36 is contacted with the elastic element 35. In response to a first force from the elastic element 35, the pressure sensing element 36 generates a first pressure sensing signal. In response to a second force from the elastic element 35, the pressure sensing element 36 generates a second pressure sensing signal. The circuit board 37 is electrically connected with the light-emitting element 34 and the pressure sensing element 36. In an embodiment, the elastic element 35 is a helical spring, the light-emitting element 34 is a light emitting diode (LED), and the circuit board 37 is a printed circuit board (PCB).

Please refer to FIG. 4 again. The movable element 33 comprises a main body 331, a coupling part 332 and a light guide post 333. The coupling part 332 is located at a first end of the main body 331 and connected with the keycap 30. The light guide post 333 is located at a second end of the main body 331, and located near the light-emitting element 34. The light guide post 333 is used for guiding the light beam B to the keycap 30 through the coupling part 332. Moreover, the elastic element 35 is sheathed around the light guide post 333 and contacted with the pressure sensing element 36. The elastic element 35 provides an elastic force to the movable element 33. In response to the elastic force, the movable element 33 is moved upwardly relative to the pedestal 31. In this embodiment, the main body 331, the coupling part 332 and the light guide post 333 are made of a light-transmissible material. Moreover, the light guide post 333 is assembled with the lower portion of the main body 331.

The pedestal 31 comprises a first pedestal opening 311 and a second pedestal opening 312. Both of first pedestal opening 311 and the second pedestal opening 312 are formed in a lower portion of the pedestal 31. The first pedestal opening 311 is located near the light-emitting element 34. The second pedestal opening 312 is located beside the first pedestal opening 311.

The pressure sensing element 36 comprises plural connecting structures 361 and a light-transmissible structure 362. The plural connecting structures 361 are penetrated through the second pedestal opening 312 and connected with the circuit board 37. Consequently, the electric connection between the pressure sensing element 36 and the circuit board 37 is established through the plural connecting structures 361. Preferably but not exclusively, the connecting structures 361 are connecting wires. In some other embodiments, the connecting structures are metallic pins.

Moreover, after the light beam B from the light-emitting element 34 passes through the first pedestal opening 311 and the light-transmissible structure 362 of the pressure sensing element 36 sequentially, the light beam B is projected to the coupling part 332 of the movable element 33 and then projected to the keycap 30. Consequently, the key structure 3 has the illuminating function. In this embodiment, the light-transmissible structure 362 is a hole, and the light guide post 333 is allowed to penetrate through the light-transmissible structure 362. It is noted that the example of the light-transmissible structure 362 is not restricted. For example, in another embodiment, the light-transmissible structure is a transparent element, and the light guide post of the movable element cannot be inserted into the light-transmissible structure.

Figure 5A:
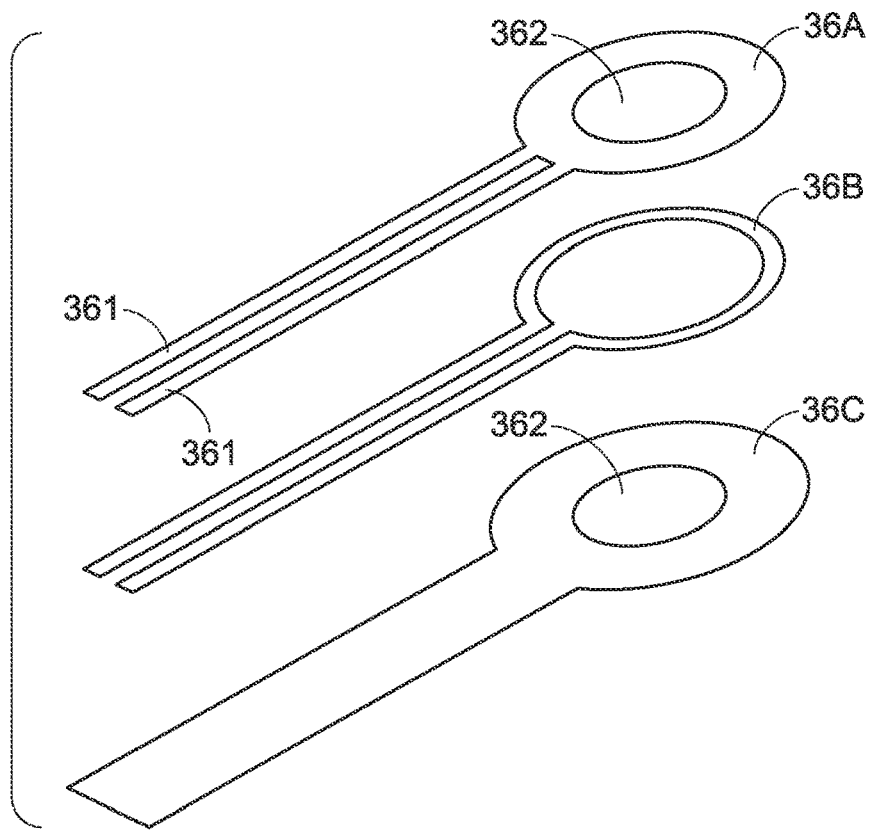
FIG. 5A is a schematic explored view illustrating a pressure sensing element according to the first embodiment of the present invention.

According to an embodiment of the present invention, the pressure sensing element 36 is a force-sensitive resistor. As shown in FIG. 5A, the pressure sensing element 36 includes an active sheet 36A, a spacer loop 36B and a conductive film 36C. The active sheet 36A includes two connecting structures 361. The light-transmissible structure 362 is formed on the active sheet 36A and the conductive film 36C. In FIG. 5A, the light-transmissible structure 362 is a hole.

Figure 5B:
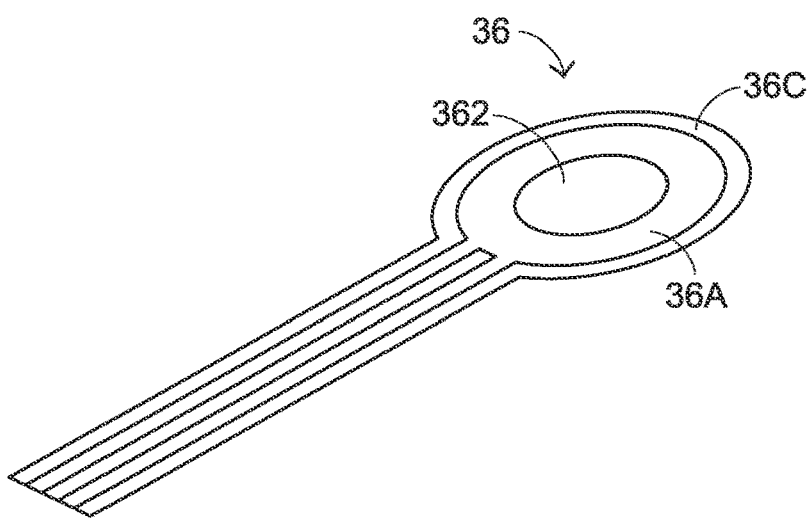
FIG. 5B is a schematic view illustrating the assembled pressure sensing element of FIG. 5A.

Please refer to FIG. 5B, the active sheet 36A, the spacer loop 36B and the conductive film 36C are stacked and combined together to form a force-sensitive resistor. The active sheet 36A is provided with conductive material. The active sheet 36A and the conductive film 36C are isolated by the spacer loop 36B. When external force is applied to the active sheet 36A (or the conductive film 36C), the sensor 36 is deformed so that the active sheet 36A comes into contact with parts of the conductive film 36C. The more of the active sheet 36A that touches the conductive film 36C, the lower the resistance generated by the sensor 36. Besides, the elastic element 35 is non-electric conductive contacted with the active sheet 36A of pressure sensing element 36.

Figure 6:
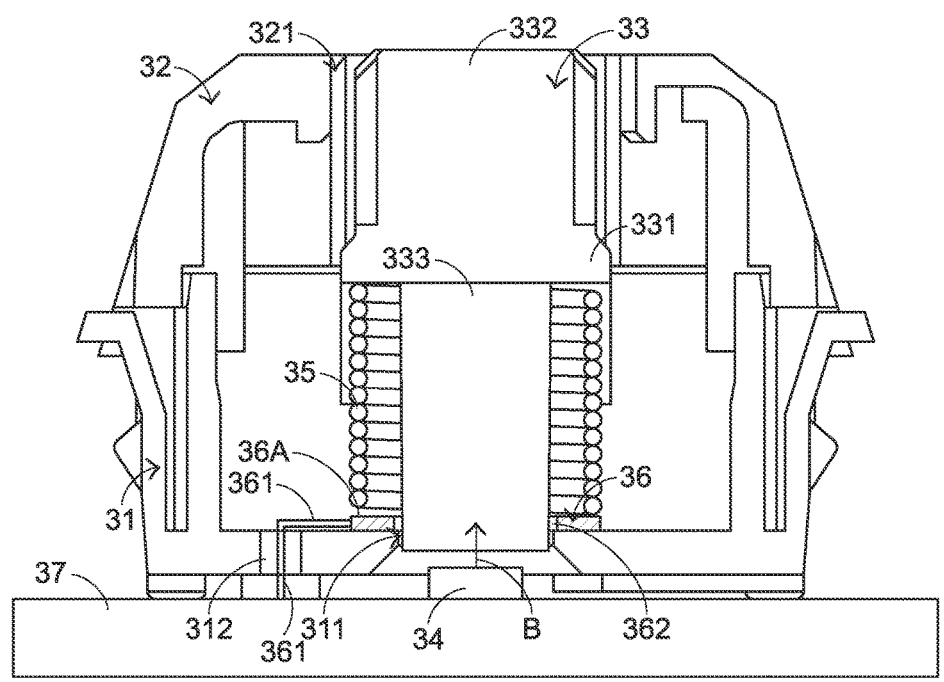
FIG. 6 is a schematic side cross-sectional view illustrating the key structure according to the first embodiment of the present invention, in which the keycap is depressed.

The operations of the key structure 3 in response to the depressing action of the user will be illustrated as follows. Please refer to FIGS. 3, 4, 5A, 5B and 6. FIG. 6 is a schematic side cross-sectional view illustrating the key structure according to the first embodiment of the present invention, in which the keycap is depressed. While the keycap 30 is depressed lightly, the keycap 30 is moved downwardly to push the movable element 33 in response to the light depressing force. As the keycap 30 is moved downwardly, the movable element 33 is moved downwardly relative to the pedestal 31. While the movable element 33 is moved downwardly, the elastic element 35 is compressed by the main body 331 of the movable element 33 (see FIG. 6). In response to a first force from the elastic element 35, the pressure sensing element 36 is deformed and parts of the active sheets 36A touches the conductive film 36C to generates a first resistance, so that the circuit board 37 generates a first pressure sensing signal corresponding to the first force. Moreover, the first pressure sensing signal is outputted through the circuit board 37. When the keycap 30 is no longer depressed by the user, no external force is applied to the keycap 30. In response to the elasticity of the elastic element 35, the compressed elastic element 35 is restored to its original shape to provide an elastic force to the movable element 33. In response to the elastic force, the movable element 33 is moved upwardly relative to the pedestal 31 and returned to its original position where it is not depressed.

While the keycap 30 is depressed heavily, the keycap 30 is moved downwardly to push the movable element 33 in response to the heavy depressing force. As the keycap 30 is moved downwardly, the movable element 33 is moved downwardly relative to the pedestal 31. While the movable element 33 is moved downwardly, the elastic element 35 is compressed by the main body 331 of the movable element 33 (see FIG. 6). In response to a second force from the elastic element 35, the pressure sensing element 36 generates a second resistance to generate a second pressure sensing signal corresponding to the second force, wherein the second force is larger than the first force. Moreover, the second pressure sensing signal is outputted through the circuit board 37. The way of returning the key structure 3 to its original position is similar to that mentioned above, and is not redundantly described herein.

From the above descriptions, the key structure 3 of the present invention generates different pressure sensing signals according to different magnitudes of the depressing force. Moreover, since different commands are executed according to different pressure sensing signals, the functions of the key structure are increased.

Figure 7:
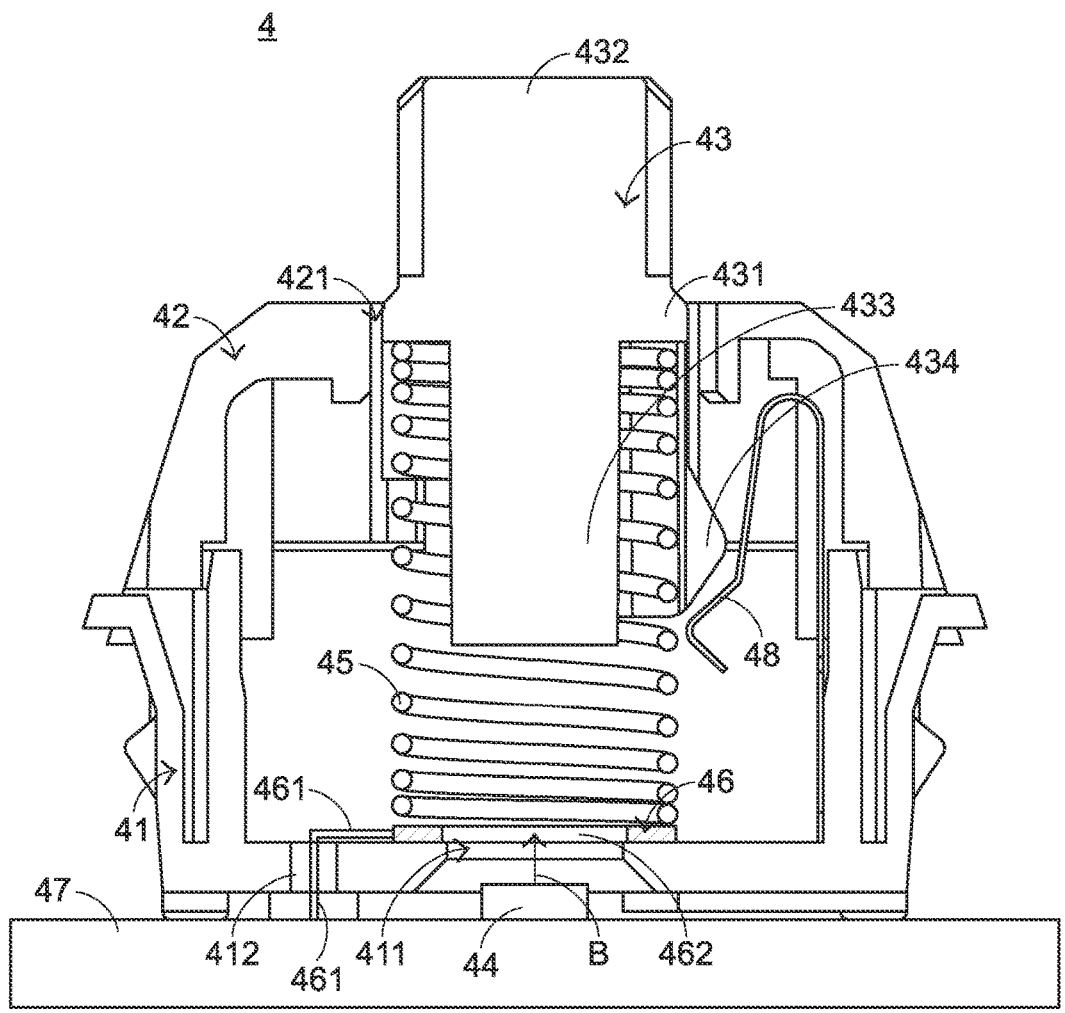
FIG. 7 is a schematic side cross-sectional view illustrating a key structure according to a second embodiment of the present invention.

The present invention further provides a second embodiment, which is distinguished from the first embodiment. FIG. 7 is a schematic side cross-sectional view illustrating a key structure according to a second embodiment of the present invention. As shown in FIG. 7, the key structure 4 comprises a keycap (not shown), a pedestal 41, an upper cover 42, a movable element 43, a light-emitting element 44, an elastic element 45, a pressure sensing element 46, a circuit board 47 and a spring strip 48. The pedestal 41 comprises a first pedestal opening 411 and a second pedestal opening 412. Moreover, the upper cover 42 has an upper cover opening 421 corresponding to the movable element 43. The pressure sensing element 46 comprises plural connecting structures 461 and a light-transmissible structure 462. The structures and functions of the components of the key structure 4 which are identical to those of the first embodiment are not redundantly described herein. In comparison with the first embodiment, the key structure 4 of this embodiment has the following two distinguished aspects. Firstly, the key structure 4 further comprises the spring strip 48. Secondly, the structure of the movable element 43 is distinguished.

Please refer to FIG. 7. The spring strip 48 is installed on the pedestal 41 and located beside the movable element 43. The movable element 43 comprises a main body 431, a coupling part 432, a light guide post 433 and a push part 434. The coupling part 432 is located at a first end of the main body 431 and connected with the keycap. The light guide post 433 is located at a second end of the main body 431, and located near the light-emitting element 44. The push part 434 is extended externally from the main body 431 and located near the spring strip 48. While the movable element 43 is moved relative to the pedestal 41, the push part 434 is contacted with the spring strip 48. Consequently, the spring strip 48 is correspondingly swung to collide with the push part 434. Meanwhile, a sound is generated. In this embodiment, the coupling part 432, the light guide post 433 and the push part 434 are integrally formed with the main body 431. Moreover, the main body 431, the coupling part 432 and the light guide post 433 are made of a light-transmissible material.

The operations of the key structure 4 in response to the depressing action of the user will be illustrated as follows. While the keycap is depressed lightly, the keycap is moved downwardly to push the movable element 43 in response to the light depressing force. As the keycap is moved downwardly, the movable element 43 is moved downwardly relative to the pedestal 41. As the movable element 43 is moved downwardly, the elastic element 45 is compressed by the main body 431 of the movable element 43. In response to a first force from the elastic element 45, the pressure sensing element 46 generates a first pressure sensing signal corresponding to the first force. Moreover, the first pressure sensing signal is outputted through the circuit board 47.

Moreover, while the movable element 43 is moved downwardly, the push part 434 is correspondingly moved downwardly to push the spring strip 48. In response to the elasticity of the spring strip 48, the spring strip 48 is correspondingly swung to collide with the push part 434. Consequently, a sound is generated. When the keycap is no longer depressed by the user, no external force is applied to the keycap. In response to the elasticity of the elastic element 45, the compressed elastic element 45 is restored to its original shape to provide an elastic force to the movable element 43. In response to the elastic force, the movable element 43 is moved upwardly relative to the pedestal 41 and returned to its original position where it is not depressed. The operations of heavily depressing the keycap are similar to those of lightly depressing the keycap, and are not redundantly described herein.

From the above descriptions, the key structure 4 of this embodiment is further equipped with the spring strip 48 and the push part 434. While the keycap is depressed, the spring strip 48 and the push part 434 of the key structure 4 are activated to generate a sound. Consequently, the user can feel the depressing feedback.

Figure 8:
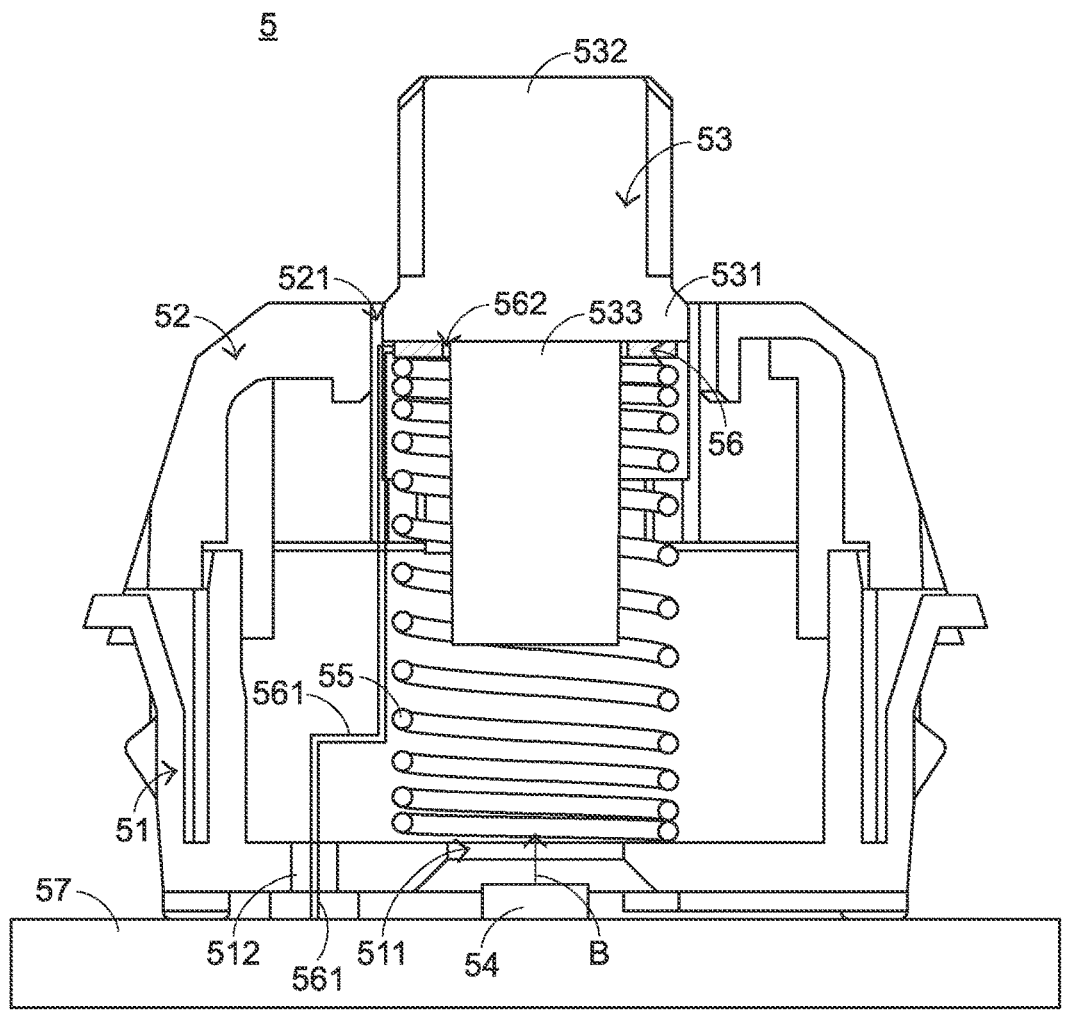
FIG. 8 is a schematic side cross-sectional view illustrating a key structure according to a third embodiment of the present invention.

The present invention further provides a third embodiment, which is distinguished from the above embodiments. FIG. 8 is a schematic side cross-sectional view illustrating a key structure according to a third embodiment of the present invention. As shown in FIG. 8, the key structure 5 comprises a keycap (not shown), a pedestal 51, an upper cover 52, a movable element 53, a light-emitting element 54, an elastic element 55, a pressure sensing element 56 and a circuit board 57. The pressure sensing element 56 includes an active sheet and a conductive film as shown in FIG. 5A. The upper cover 52 has an upper cover opening 521 corresponding to the movable element 53. The movable element 53 comprises a main body 531, a coupling part 532 and a light guide post 533. The structures and functions of the components of the key structure 5 which are identical to those of the first embodiment are not redundantly described herein. In comparison with the first embodiment, the position and installation of the pressure sensing element 56 of the key structure 5 are distinguished.

As shown in FIG. 8, the pressure sensing element 56 is arranged around the light guide post 533 of the movable element 53. The pressure sensing element 56 comprises plural connecting structures 561 and a hole 562. The electric connection between the pressure sensing element 56 and the circuit board 57 is established through the plural connecting structures 561. The light guide post 533 is penetrated through the hole 562, so that the pressure sensing element 56 is disposed on the light guide post 533. Moreover, the elastic element 55 is sheathed around the light guide post 533 of the movable element 53 and contacted with a bottom surface of the pressure sensing element 56. That is, the pressure sensing element 56 is arranged in an upside-down manner.

The operations of the key structure 5 in response to the depressing action of the user will be illustrated as follows. While the keycap is depressed lightly, the keycap is moved downwardly to push the movable element 53 in response to the light depressing force. As the keycap is moved downwardly, the movable element 53 is moved downwardly relative to the pedestal 51. As the movable element 53 is moved downwardly, the pressure sensing element 56 around the light guide post 533 is moved downwardly to compress the elastic element 55. Since the compressed elastic element 55 is contacted with the pedestal 51, the compressed elastic element 55 provides a counterforce to the pressure sensing element 56. At the same time, the main body 531 of the movable element 53 also provides a force to the pressure sensing element 56. That is, a first force is provided to the pressure sensing element 56 by the movable element 53 and the elastic element 55 collaboratively. In response to the first force, the pressure sensing element 56 generates a first pressure sensing signal corresponding to the first force. Moreover, the first pressure sensing signal is outputted through the circuit board 57. When the keycap is no longer depressed by the user, no external force is applied to the keycap. In response to the elasticity of the elastic element 55, the compressed elastic element 55 is restored to its original shape to provide an elastic force to the pressure sensing element 56 and the movable element 53. In response to the elastic force, the movable element 53 is moved upwardly relative to the pedestal 51 and returned to its original position where it is not depressed. The operations of heavily depressing the keycap are similar to those of lightly depressing the keycap, and are not redundantly described herein.

The following two aspects should be specially described. Firstly, the light guide post 533 is assembled with the lower portion of the main body 531, or the light guide post 533 is integrally formed with the main body 531. Secondly, the pressure sensing element 56 is arranged around the light guide post 533 and away from the circuit board 57, but the pressure sensing element 56 is electrically connected with the circuit board 57 through the plural connecting structures 561. In this embodiment, the pressure sensing element 56 and the plural connecting structures 561 are flexible because they are made of soft materials. Consequently, while the pressure sensing element 56 is moved upwardly or downwardly with the movable element 53, the plural connecting structures 561 are correspondingly bent or stretched and not broken. Consequently, the electric connection between the pressure sensing element 56 and the circuit board 57 can be maintained.

Figure 9:
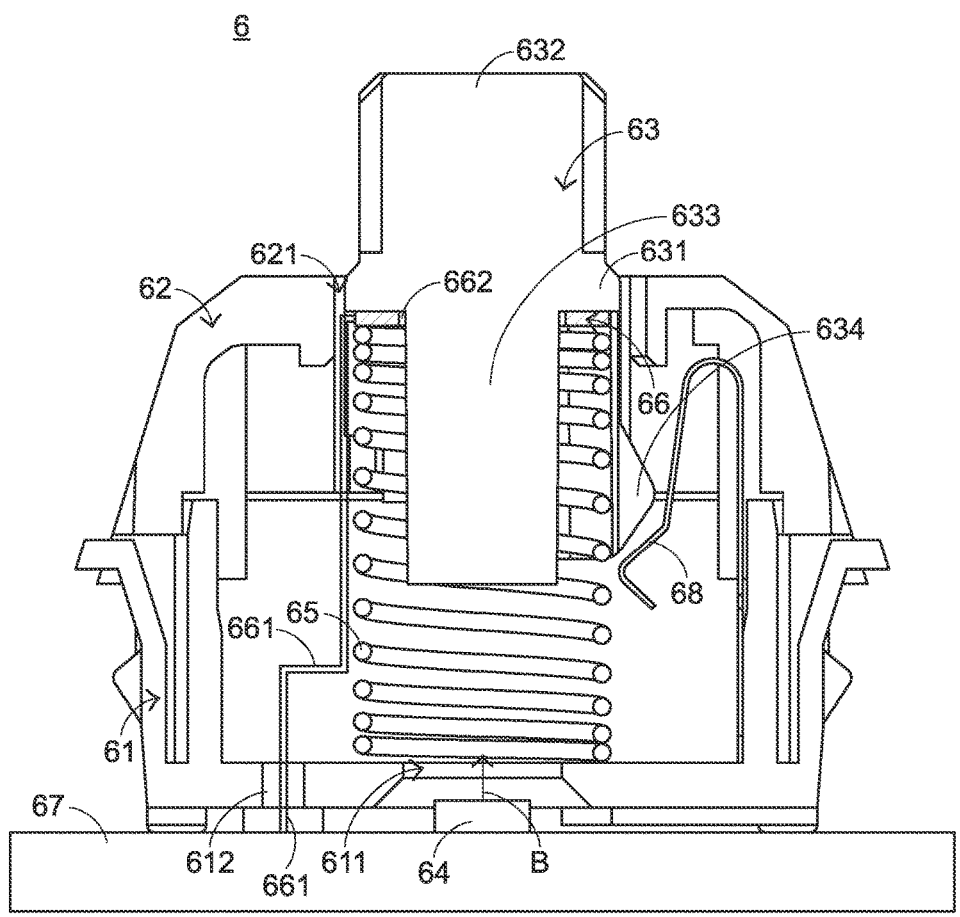
FIG. 9 is a schematic side cross-sectional view illustrating a key structure according to a fourth embodiment of the present invention.

The present invention further provides a fourth embodiment, which is distinguished from the above embodiments. FIG. 9 is a schematic side cross-sectional view illustrating a key structure according to a fourth embodiment of the present invention. As shown in FIG. 9, the key structure 6 comprises a keycap (not shown), a pedestal 61, an upper cover 62, a movable element 63, a light-emitting element 64, an elastic element 65, a pressure sensing element 66, a circuit board 67 and a spring strip 68. The pedestal 61 comprises a first pedestal opening 611 and a second pedestal opening 612. Moreover, the upper cover 62 has an upper cover opening 621 corresponding to the movable element 63. The pressure sensing element 66 comprises plural connecting structures 661 and a hole 662. The movable element 63 comprises a main body 631, a coupling part 632, a light guide post 633 and a push part 634. The structures and functions of the components of the key structure 6 which are identical to those of the above embodiments are not redundantly described herein. In comparison with the second embodiment, the position and installation of the pressure sensing element 66 of the key structure 6 are distinguished.

As shown in FIG. 9, the pressure sensing element 66 is arranged around the light guide post 633 of the movable element 63. The pressure sensing element 66 comprises plural connecting structures 661 and a hole 662. The light guide post 633 is penetrated through the hole 662, so that the pressure sensing element 66 is disposed on the light guide post 633. Moreover, the elastic element 65 is sheathed around the light guide post 633 of the movable element 63 and contacted with a bottom surface of the pressure sensing element 66. That is, the pressure sensing element 66 is arranged in an upside-down manner.

The operations of the key structure 6 in response to the depressing action of the user will be illustrated as follows. While the keycap is depressed lightly, the keycap is moved downwardly to push the movable element 63 in response to the light depressing force. As the keycap is moved downwardly, the movable element 63 is moved downwardly relative to the pedestal 61. As the movable element 63 is moved downwardly, the pressure sensing element 66 around the light guide post 633 is moved downwardly to compress the elastic element 65. Since the compressed elastic element 65 is contacted with the pedestal 61, the compressed elastic element 65 provides a counterforce to the pressure sensing element 66. At the same time, the main body 631 of the movable element 63 also provides a force to the pressure sensing element 66. That is, a first force is provided to the pressure sensing element 66 by the movable element 63 and the elastic element 65 collaboratively. In response to the first force, the pressure sensing element 66 generates a first pressure sensing signal corresponding to the first force. Moreover, the first pressure sensing signal is outputted through the circuit board 67. Moreover, while the movable element 63 is moved downwardly, the push part 634 is correspondingly moved downwardly to push the spring strip 68. In response to the elasticity of the spring strip 68, the spring strip 68 is correspondingly swung to collide with the push part 634. Consequently, a sound is generated. When the keycap is no longer depressed by the user, no external force is applied to the keycap. In response to the elasticity of the elastic element 65, the compressed elastic element 65 is restored to its original shape to provide an elastic force to the pressure sensing element 66 and the movable element 63. In response to the elastic force, the movable element 63 is moved upwardly relative to the pedestal 61 and returned to its original position where it is not depressed. The operations of heavily depressing the keycap are similar to those of lightly depressing the keycap, and are not redundantly described herein.

Figure 10:
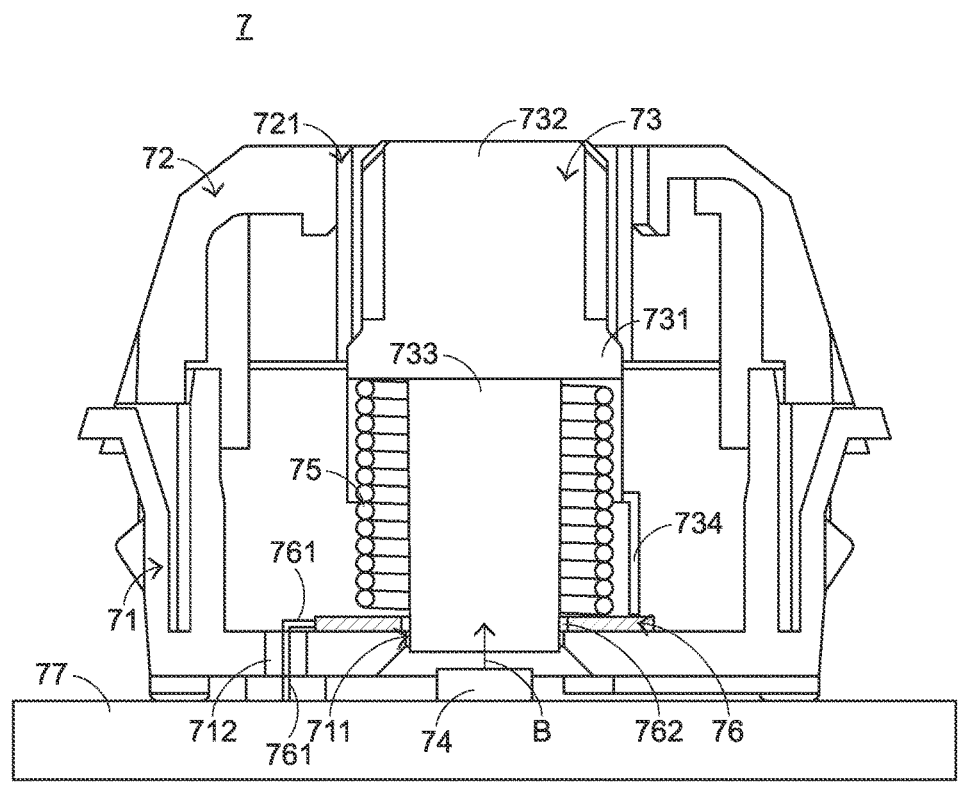
FIG. 10 is a schematic side cross-sectional view illustrating a key structure according to a fifth embodiment of the present invention, in which the keycap is depressed.

The present invention further provides a fifth embodiment, which is distinguished from the above embodiments. FIG. 10 is a schematic side cross-sectional view illustrating a key structure according to a fifth embodiment of the present invention, in which the keycap is depressed. As shown in FIG. 10, the key structure 7 comprises a keycap (not shown), a pedestal 71, an upper cover 72, a movable element 73, a light-emitting element 74, an elastic element 75, a pressure sensing element 76, a circuit board 77 and a spring strip 78. The pedestal 71 comprises a first pedestal opening 711 and a second pedestal opening 712. Moreover, the upper cover 72 has an upper cover opening 721 corresponding to the movable element 73. The pressure sensing element 76 comprises plural connecting structures 761 and a hole 762. The structures and functions of the components of the key structure 7 which are identical to those of the above embodiments are not redundantly described herein. In comparison with the first embodiment, the structure of the movable element 73 is distinguished.

Similarly, the movable element 73 comprises a main body 731, a coupling part 732, a light guide post 733 and a push part 734. In addition, the movable element 73 further comprises a triggering part 734. The triggering part 734 is extended externally from the main body 731. While the movable element 73 is moved relative to the pedestal 71, the pressure sensing element 76 is pushed by the elastic element 75 and the pressure sensing element 76 is also pushed by the triggering part 734. In response to a third force from the elastic element 75 and the triggering part 734, the pressure sensing element 76 generates a third sensing signal. Consequently, the functions of the key structure 7 are increased.

In an embodiment, an illuminating function and a pressure sensing function of the key structure are cooperatively implemented. For example, when the keycap is depressed lightly, the circuit board outputs the corresponding first pressure sensing signal. According to the first pressure sensing signal, the light-emitting element is controlled to generate a light beam with a first lighting effect. Whereas, when the keycap is depressed heavily, the circuit board outputs the corresponding second pressure sensing signal. According to the second pressure sensing signal, the light-emitting element is controlled to generate a light beam with a second lighting effect. For example, the light beam with the first lighting effect is a slow flickering light, and the light beam with the second lighting effect is a fast flickering light. According to the lighting effect, the user can recognize whether a lightly depressed function or a heavily depressed function is enabled. It is noted that the cooperative functions of the key structure are not restricted to the illuminating function and the pressure sensing function.

In the above embodiments, the pressure sensing element of the key structure of the present invention is triggered by the movable element or the elastic element. It is noted that the component of triggering the pressure sensing element is not restricted to the movable element or the elastic element. For example, in another embodiment, an elastic structure is formed on an inner surface of the pedestal and located near the pressure sensing element. While the movable element is moved relative to the pedestal, the elastic structure is pushed by the movable element and the pressure sensing element is triggered by the elastic element. Consequently, the corresponding pressure sensing signal is generated.

From the above descriptions, the present invention provides the key structure. The key structure is equipped with a light-emitting element and a movable element that is made of a light-transmissible material. Consequently, the key structure has the illuminating function. Moreover, the key structure has the pressure sensing element. By means of the pressure sensing element, the key structure generates different pressure sensing signals according to different magnitudes of the depressing force. Since the functions of the key structure are increased, the drawbacks of the conventional technologies are overcome. Optionally, the key structure is equipped with the spring strip according to the requirements of the user. The key structure with the spring strip can provide the depressing feedback to the user. Moreover, the key structure without the spring strip has reduced volume, and thus the key structure is slim.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A key structure, comprising:
    a pedestal;
    an upper cover having an upper cover opening, wherein the pedestal is covered by the upper cover;
    a movable element disposed on the pedestal and partially penetrated through the upper cover opening, wherein while the movable element is depressed, the movable element is moved relative to the pedestal;
    an elastic element sheathed around the movable element;
    a light-emitting element disposed under the pedestal, and emitting a light beam to the movable element; and
    a pressure sensing element disposed on the movable element, and contacted with the elastic element, wherein the pressure sensing element generates a first pressure sensing signal in response to a first force, or the pressure sensing element generates a second pressure sensing signal in response to a second force.

2. The key structure according to claim 1, wherein the key structure further comprises a circuit board, and the circuit board is disposed under the pedestal and electrically connected with the light-emitting element and the pressure sensing element, wherein when the pressure sensing element is triggered, the circuit board outputs the first pressure sensing signal or the second pressure sensing signal.

3. The key structure according to claim 1, wherein the movable element comprises:
    a main body;
    a coupling part located at a first end of the main body and connected with a keycap;
    a light guide post located at a second end of the main body, and located near the light-emitting element,
    wherein while the movable element is moved relative to the pedestal, the pressure sensing element is pushed by the main body or the elastic element.

4. The key structure according to claim 3, wherein the main body, the coupling part and the light guide post are made of a light-transmissible material, and the pressure sensing element and the elastic element are arranged around the light guide post.

5. The key structure according to claim 3, wherein the key structure further comprises a spring strip, and the spring strip is installed on the pedestal and located beside the movable element, wherein the movable element further comprises a push part, and the push part is extended externally from the main body and located near the spring strip, wherein while the movable element is moved relative to the pedestal, the movable element is contacted with the spring strip, so that the spring strip is swung to collide with the push part and generate a sound.

6. The key structure according to claim 3, wherein the pressure sensing element comprises a hole and the light guide post is penetrated through the hole, wherein the pressure sensing element is disposed on the light guide post.

* * * * *